(12) United States Patent
Formosa

(10) Patent No.: US 7,675,170 B2
(45) Date of Patent: Mar. 9, 2010

(54) REMOVABLE WAFER EXPANDER FOR DIE BONDING EQUIPMENT

(75) Inventor: Kevin Formosa, Zabbar (MT)

(73) Assignee: STMicroelectronics Ltd, Kirkop (MT)

( * ) Notice: Subject to any disclaimer, the term of this patent is extended or adjusted under 35 U.S.C. 154(b) by 385 days.

(21) Appl. No.: 11/833,605

(22) Filed: Aug. 3, 2007

(65) Prior Publication Data
US 2008/0032489 A1    Feb. 7, 2008

(51) Int. Cl.
*H01L 21/00* (2006.01)

(52) U.S. Cl. ............... 257/738; 257/676; 257/778; 257/780; 257/783; 257/E21.503; 257/E21.599; 257/E23.039; 257/E23.042; 257/E23.092; 438/106; 438/110; 438/118; 438/458; 438/462

(58) Field of Classification Search ......... 257/676, 257/738, 788, 780, 783, E21.503, 504, 599, 257/E23.039, 42, 92, 193; 438/106, 110, 438/113, 118, 121–124, 458–472
See application file for complete search history.

(56) References Cited

U.S. PATENT DOCUMENTS

| | | | | |
|---|---|---|---|---|
| 3,899,379 A * | 8/1975 | Wanesky | ............... | 156/80 |
| 4,259,365 A * | 3/1981 | Ruppel et al. | ............... | 438/3 |
| 4,485,125 A * | 11/1984 | Izu et al. | ............... | 427/74 |
| 4,684,424 A * | 8/1987 | Augason | ............... | 156/163 |
| 5,407,507 A * | 4/1995 | Ball | ............... | 156/163 |
| 5,603,889 A * | 2/1997 | Ohno | ............... | 264/510 |
| 5,813,893 A * | 9/1998 | Robinson | ............... | 445/25 |
| 5,822,038 A * | 10/1998 | Slater et al. | ............... | 355/22 |
| 5,900,093 A * | 5/1999 | Langenbrunner | ............... | 156/229 |
| 5,904,500 A * | 5/1999 | Tay | ............... | 438/118 |
| 6,458,627 B1 * | 10/2002 | Choi | ............... | 438/122 |
| 6,582,983 B1 * | 6/2003 | Runyon et al. | ............... | 438/33 |
| 6,713,366 B2 * | 3/2004 | Mong et al. | ............... | 438/459 |
| 6,794,751 B2 * | 9/2004 | Kumamoto | ............... | 257/738 |
| 7,176,106 B2 * | 2/2007 | Snyder et al. | ............... | 438/455 |
| 2005/0215033 A1 | 9/2005 | Yamamoto et al. | | |
| 2006/0083900 A1 * | 4/2006 | Ashraf | ............... | 428/182 |
| 2006/0128065 A1 | 6/2006 | Inada et al. | | |
| 2006/0204749 A1 * | 9/2006 | Kita et al. | ............... | 428/343 |
| 2007/0141330 A1 * | 6/2007 | Morishima et al. | ............... | 428/343 |
| 2008/0261039 A1 * | 10/2008 | Tanaka et al. | ............... | 428/352 |

FOREIGN PATENT DOCUMENTS

JP    07122583    5/1995

* cited by examiner

*Primary Examiner*—Michael S Lebentritt
(74) *Attorney, Agent, or Firm*—Lisa K. Jorgenson; E. Russell Tarleton; Seed IP Law Group PLLC

(57) ABSTRACT

A removable wafer expander for die bonding equipment for a singularized wafer supported by a flexible sticky substrate, the removable wafer expander provided with a first ring member to be coupled with a second ring member for remote expansion of the flexible sticky substrate therebetween before the mounting of the wafer expander onto the die bonding equipment.

15 Claims, 3 Drawing Sheets

REMOVABLE WAFER EXPANDER FOR DIE BONDING EQUIPMENT

BACKGROUND

1. Technical Field

The present disclosure pertains to a removable wafer expander for die bonding equipment.

2. Description of the Related Art

In the assembly of semiconductor devices, a wafer is mounted onto a flexible sticky foil held by a metal ring. After wafer sawing for singularizing the dies within each wafer, every individual die has to be picked from the sticky foil and placed directly on a substrate over a die attach material (package).

Thus is provided pick-and-place equipment with a die ejector system that pushes the die back side to break the adhesion forces of the sticky foil. A vacuum pick-up tool (robotic arm) picks the die and through coordinated motion places the picked die over the targeted placement position.

Critical parameters for the pick-up process are the die back side adhesion to the sticky foil and the separation between each die. The latter is mainly governed by the "wafer street width" and consequently by the cutting blade thickness.

The market trend is to continuously reduce the die size, maximizing the number of dies per wafer. Thus, stretching the sawn wafer to uniformly enlarging the separation between each die is an option to be considered to optimize the die pick-up process.

The deformation of the sticky foil happens on the die bonding equipment, and the expansion is not suddenly recovered on releasing the wafer expander from the die bonding equipment. In some cases a permanent deformation occurs; therefore, it is not possible to use the wafer anymore.

Thus, it is highly advisable that the wafer remains expanded by the wafer expander of the die bonding equipment until the full process is completed, namely until all the dies are removed from the sticky foil.

This is a limitation for multi-chip die bonding equipment. The bonding process is similar to the process described above, but after the completion of the first die the equipment has to change the wafer because a different die is required for the same package.

Therefore, in such process where it is inherent to load and reload the same wafer several times, the setup process is provided without wafer expansion.

As a consequence the lack of clearance between adjacent dies will induce various pick-up process issues.

BRIEF SUMMARY

The present disclosure provides a wafer expander for die bonding equipment by which it is possible to load and reload the same wafer several times, maintaining the wafer in an expanded condition.

According to the disclosure, a removable wafer expander for a die bonding equipment for singularized wafer supported by a flexible sticky substrate is provided, and it includes a first ring member to be coupled with a second ring member for a remote expansion of the flexible sticky substrate therebetween before the mounting of the wafer expander onto the die bonding equipment.

It is in particular advisable to use the removable wafer expander on multi-chip die bonding equipment. Several removable wafer expanders can be prepared for the same equipment and mounted in turn thereon, maintaining several wafers contemporaneously expanded.

In accordance with another aspect of the present disclosure, a device is provided that includes a first frame having a first holding member; a second frame having a second holding member, the second frame sized and shaped so that the second holding member couples with the first holding member to engage and stretch the foil when the first frame and the second frame are coupled together.

In accordance with another embodiment of the present disclosure, an assembly is provided that includes a first frame; a second frame sized and shaped to be coupled to the first frame; a flexible substrate having one or more die releasably held thereto; and a first engaging member associated with the first frame and a second engaging member associated with the second frame, the first and second engaging members sized and shaped to be releasably mated together to securely hold the substrate and stretch the substrate such that additional space is provided on the substrate between each die mounted on the substrate. Ideally, the first frame includes one of a channel or a protrusion and the other frame includes the other of the channel and protrusion. Alternatively, the first frame can have one or more openings or channels and the second frame can have one or more mating protrusions formed thereon that engage and stretch the substrate for creating additional space between the die and otherwise holding the substrate taut to prevent unintentional bending of the die as the die are removed from the substrate.

BRIEF DESCRIPTION OF THE SEVERAL VIEWS OF THE DRAWINGS

The characteristics and advantages of the present disclosure will appear evident from the following detailed description of an embodiment thereof illustrated as non-limiting example in the enclosed drawings, in which.

DETAILED DESCRIPTION

Figure 1:
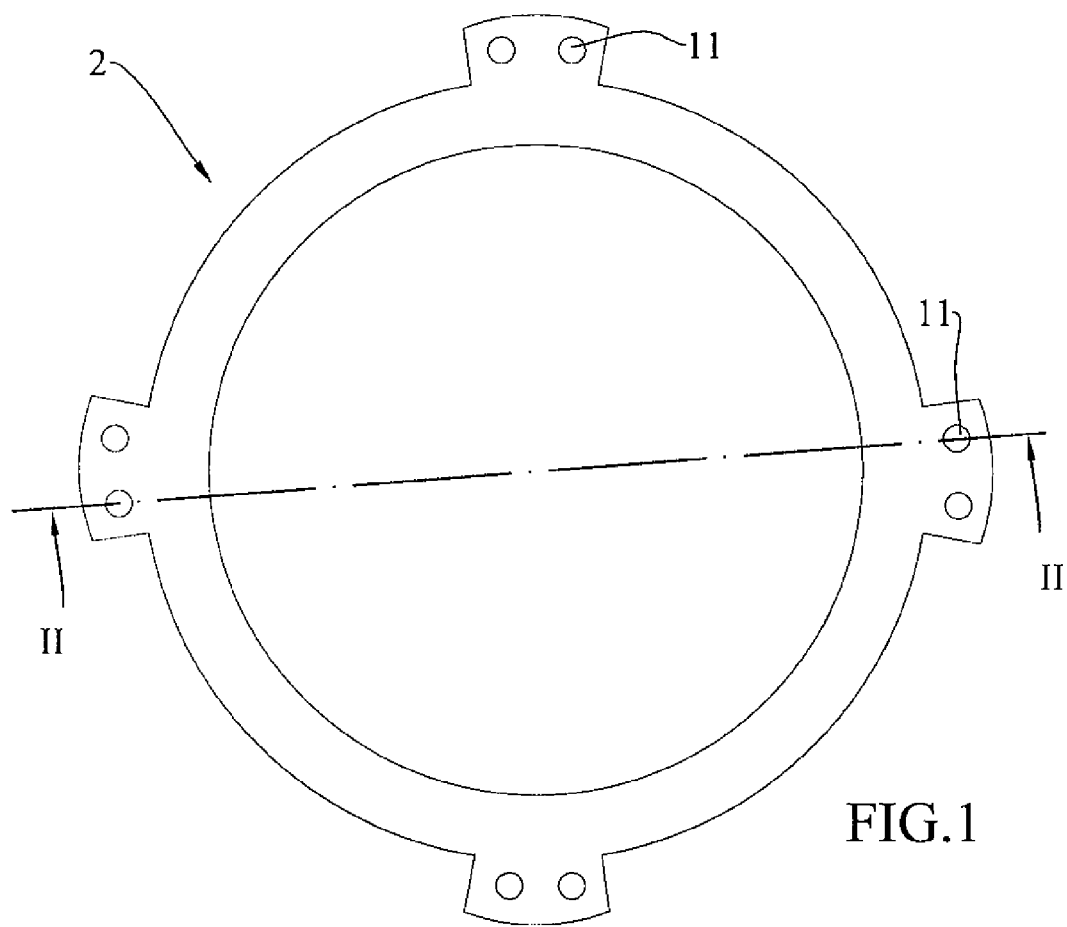
FIG. 1 is a top view of a first coupling ring of a removable wafer expander.
Figure 2:
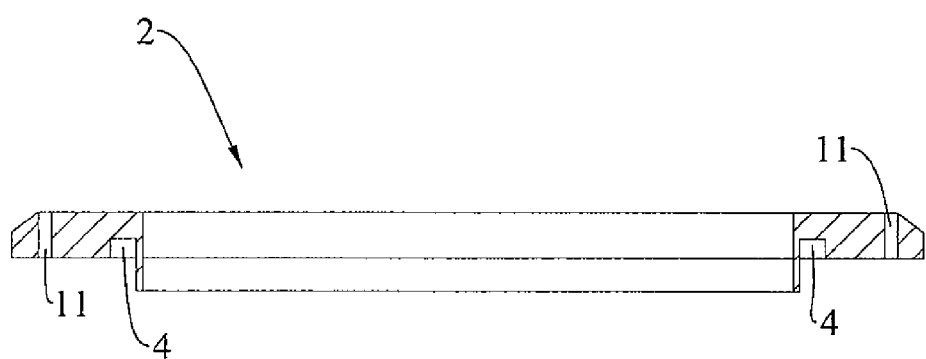
FIG. 2 is a sectional view according to line II-II of FIG. 1.
Figure 3:
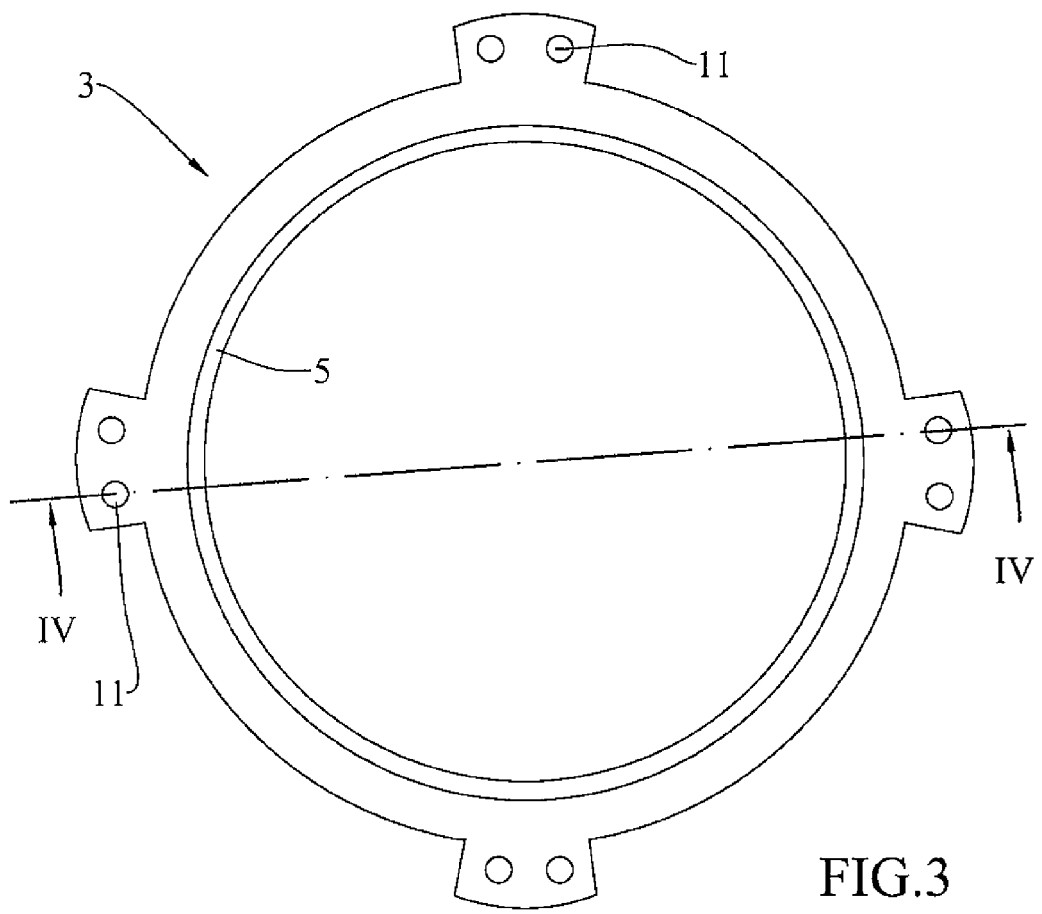
FIG. 3 is a top view of a second coupling ring of the removable wafer expander.
Figure 4:
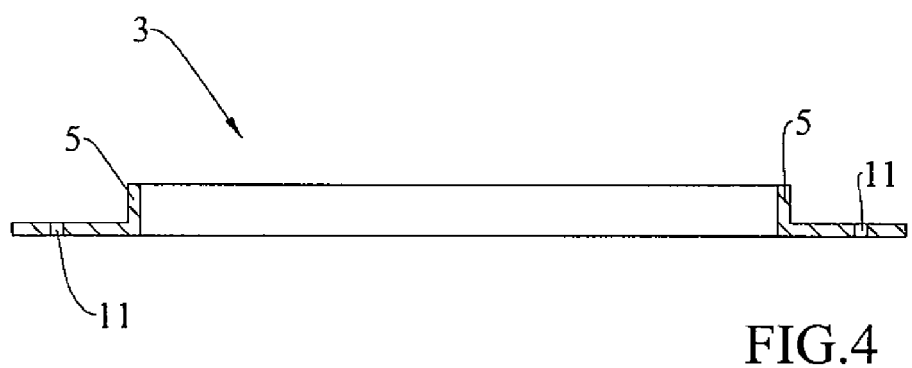
FIG. 4 is a sectional view according to line IV-IV of FIG. 1.

Referring to FIGS. 1-4, a removable wafer expander 1 for a multi-chip die bonding equipment is shown having a superior ring 2 and an inferior ring 3. The superior ring 2 is provided with an annular cavity 4 to be coupled with an annular protrusion 5 of the inferior ring 3.

Figure 6:
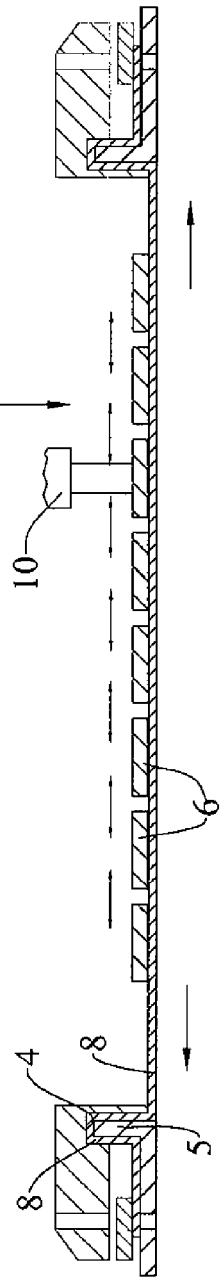
FIG. 6 is a longitudinal sectional view of the wafer expander in a work position with the flexible sticky foil expanded.

Both rings 2-3 are provided with holes 11 for locking means, such as clips or fasteners, to maintain the rings in a work position (FIG. 6). Dies 6 of a singularized wafer 7 are mounted onto a flexible substrate, such as a sticky foil 8 supported by a metal ring 9 (wafer assembly 20). The equipment includes also a robotic arm 10 for the die pick-up process.

The multi-chip die bonding equipment is useful for packages to be loaded with dies of different sizes. Away from the equipment, more than one wafer assembly 20 are expanded as follow.

Figure 5:
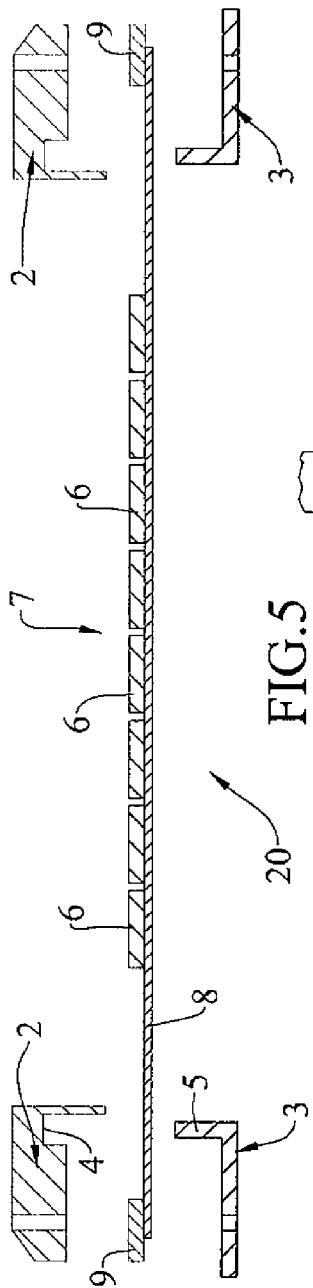
FIG. 5 is a longitudinal sectional view of the wafer expander in a rest position with the flexible sticky foil supporting the wafer before its expansion.

A wafer assembly 20 is positioned between the superior and the inferior rings 2-3 in the rest position of FIG. 5. The rings 2-3 clamp the wafer assembly 20, expanding the sticky foil 8 (FIG. 6), due to the coupling between a protrusion 5 on the inferior ring 3 and the cavity 4 on the superior ring 2. The space between each die increases, thus the pick-up process made by the robotic arm 10 is easier. Therefore the critical parameters of each wafer assembly 20 increase.

It is to be understood that the upright protrusion 5 can be formed on a first frame, such as the superior ring 2 and sized and shaped to mate with a corresponding cavity or opening in a second frame, such as the inferior ring 3. Alternatively, the annular cavity can be one or more openings sized, shaped, and positioned on the first frame to mate with one or more protrusions on the second frame. The protrusion and channel are sized and shaped to hold the substrate or foil securely without tearing of the same.

After the wafer expansion, the wafer expander is mounted on the multi-chip die bonding equipment for the pick-up process. If a control unit calls for a different die supported by a different wafer expander, the previous wafer expander is unloaded from the equipment and a new wafer expander is loaded thereon.

Figure 7:
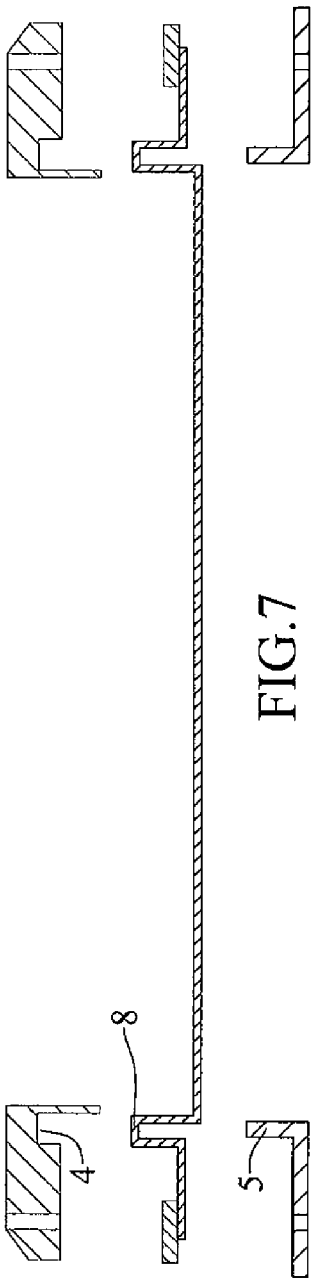
FIG. 7 is a longitudinal sectional view of the wafer expander in a rest position after the sticky foil expansion.

When all the dies 6 are picked-up from its sticky foil 8, the rings 2-3 release the permanently deformed die-empty sticky foil 8 (FIG. 7) for a new not deformed die-full sticky foil 8.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A removable wafer expander for die bonding equipment for a singularized wafer supported by flexible sticky means, comprising:
   a first ring member coupled with a second ring member for remote expansion of the flexible sticky means therebetween before the mounting of the wafer expander onto the die bonding equipment.

2. The removable wafer expander of claim 1, wherein the first ring member comprises an annular cavity coupled in a work position with an annular protrusion of the second ring member, the flexible sticky means included between the first and second ring members, and expanded thereby.

3. The removable wafer expander of claim 1, wherein the expander is adapted for use with multi-chip die bonding equipment.

4. The removable wafer expander of claim 1, wherein said ring members are held in work position by locking means.

5. The removable wafer expander of claim 1, wherein the sticky means comprises sticky foil.

6. A device for holding a flexible substrate having objects mounted thereon, the device comprising:
   a first frame having a first holding member;
   a second frame having a second holding member, the second frame sized and shaped so that the second holding member couples with the first holding member to engage and stretch the substrate when the first frame and the second frame are coupled together.

7. The device of claim 6, wherein the first holding member comprises one of either a channel and a protrusion, and the second holding member comprises the other of a channel and protrusion.

8. The device of claim 7, wherein the substrate is stretched by the first and second holding members to increase space between the objects on the substrate.

9. The device of claim 7, further comprising at least one latch for releasably holding the first and second frames together.

10. An assembly for holding objects, comprising:
    a first frame;
    a second frame sized and shaped to be coupled to the first frame;
    a substrate having one or more objects releasably held thereto; and
    a first engaging member associated with the first frame and a second engaging member associated with the second frame, the first and second engaging members sized and shaped to hold the substrate and stretch the substrate.

11. The assembly of claim 10, wherein the first engaging member comprises one of a channel and a protrusion, and the second engaging member comprises the other of the channel and the protrusion.

12. The assembly of claim 10, further comprising at least one latch for releasably holding the first frame to the second frame with the first and second engaging members in mating relationship and holding the foil in a stretched condition.

13. The assembly of claim 10, wherein the first engaging member comprises a plurality of openings in the first frame and the second engaging member comprises a plurality of extensions on the second frame member that are sized, shaped, and positioned to be received within the first engaging member openings.

14. The assembly of claim 10, wherein the first engaging member and second engaging member are structured to engage one another at one or more engagement points and hold the substrate at the one or more engagement points.

15. The assembly of claim 10, wherein the substrate comprises sticky foil.

* * * * *

UNITED STATES PATENT AND TRADEMARK OFFICE
CERTIFICATE OF CORRECTION

PATENT NO. : 7,675,170 B2  Page 1 of 1
APPLICATION NO. : 11/833605
DATED : March 9, 2010
INVENTOR(S) : Kevin Formosa It is certified that error appears in the above-identified patent and that said Letters Patent is hereby corrected as shown below:

On the Title Pg, Item (30)
Item (30), Foreign Application Priority Data is missing from the face of the patent. Item (30) should read:

--(30) Foreign Application Priority Data
August 3, 2006  (EP)  06118420.6--

Signed and Sealed this

Twenty-eighth Day of September, 2010

David J. Kappos
*Director of the United States Patent and Trademark Office*